United States Patent
Disegni et al.

(10) Patent No.: US 12,014,084 B2
(45) Date of Patent: Jun. 18, 2024

(54) DATA MEMORY ACCESS COLLISION MANAGER, DEVICE AND METHOD

(71) Applicant: STMICROELECTRONICS S.r.l., Agrate Brianza (IT)

(72) Inventors: Fabio Enrico Carlo Disegni, Spino d'Adda (IT); Federico Goller, Turin (IT); Dario Falanga, Vimercate (IT); Michele Febbrarino, Bagheria (IT); Massimo Montanaro, Cava Manara (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 101 days.

(21) Appl. No.: 17/669,085

(22) Filed: Feb. 10, 2022

(65) Prior Publication Data

US 2023/0251795 A1    Aug. 10, 2023

(51) Int. Cl.
*G06F 3/06* (2006.01)

(52) U.S. Cl.
CPC ............ *G06F 3/0659* (2013.01); *G06F 3/061* (2013.01); *G06F 3/0679* (2013.01)

(58) Field of Classification Search
CPC ...... G06F 3/061; G06F 3/0659; G06F 3/0679; G11C 7/24; G11C 8/12; G11C 16/22
See application file for complete search history.

(56) References Cited

U.S. PATENT DOCUMENTS

| | | | |
|---|---|---|---|
| 5,287,469 A | 2/1994 | Tsuboi | |
| 8,621,160 B2 | 12/2013 | Wang et al. | |
| 9,507,602 B2 | 11/2016 | Alexander et al. | |
| 10,489,058 B2 | 11/2019 | Zhao et al. | |
| 2005/0050283 A1* | 3/2005 | Miller | G06F 9/526 711/151 |
| 2006/0083174 A1 | 4/2006 | Shim et al. | |
| 2007/0239926 A1 | 10/2007 | Gyl et al. | |
| 2011/0044451 A1* | 2/2011 | Anzai | G06F 21/51 711/E12.001 |
| 2012/0324179 A1 | 12/2012 | Farrell et al. | |
| 2016/0320989 A1* | 11/2016 | Bromberg | G06F 12/00 |
| 2022/0035566 A1 | 2/2022 | Henze et al. | |

FOREIGN PATENT DOCUMENTS

CN    106598548 A    4/2017

* cited by examiner

*Primary Examiner* — Larry T Mackall
(74) *Attorney, Agent, or Firm* — Seed IP Law Group LLP (57) ABSTRACT

A non-volatile memory receives a data read request from a processing core of a plurality of processing cores. The read request is directed to a data partition of a non-volatile memory. The non-volatile memory determines whether to process the read request using read-while-write collision management. When it is determined to process the read request using read-while-write collision management, an address associated with the read request is stored in an address register of a set of registers associated with the processing core. Write operations directed to the data partition are suspended. A read operation associated with the read request is executed while the write operations are suspended and data responsive to the read operation is stored in one or more data registers of the set of registers. The data stored in the one or more data registers of the set of registers is provided to the processing core.

25 Claims, 8 Drawing Sheets

DATA MEMORY ACCESS COLLISION MANAGER, DEVICE AND METHOD

BACKGROUND

Technical Field

The present disclosure generally relates to managing data access collisions, such as collisions between a read request and a write request to a memory partition of a non-volatile memory array.

Description of the Related Art

A system on a chip (SoC) may typically have multiple processing cores accessing a non-volatile memory (NVM). The NVM may typically be divided into partitions, such as one or more partitions to store code for execution by the various processing cores, and one or more partitions to store data for use by the various processing cores. Collisions between memory accesses to data, such as read and write accesses to the NVM by different processing cores, may occur. In addition, the processing cores may include standard processing cores, which may share data with other processing cores, for example, through software data exchanges using a shared NVM, and secure processing cores which typically do not share data with other processing cores through software data exchanges using shared NVM.

BRIEF SUMMARY

In an embodiment, a device comprises a plurality of sets of registers, which, in operation, store addresses and data associated with data read requests received from respective processing cores of a plurality of processing cores, the data read requests being directed to a data partition of a non-volatile memory. The device includes control circuitry coupled to the plurality of sets of registers. The control circuitry, in a read-while-write collision management mode of operation, responds to a data read request received from one processing core of the plurality of processing cores and directed to the data partition by: storing an address associated with the data read request in an address register of one of the plurality of sets of registers associated with the one processing core; requesting suspension of write operations directed to the data partition and execution of a read operation associated with the read request while the write operations are suspended; storing data responsive to the read operation in one or more data registers of the one of the plurality of sets of registers; and providing the data stored in the one or more data registers of the one of the plurality of sets of registers to the one processing core.

In an embodiment, a system comprises a plurality of processing cores and a non-volatile memory coupled to the plurality of processing cores. The non-volatile memory has a data partition, a plurality of sets of registers, which, in operation, store addresses and data associated with data read requests received from respective processing cores of the plurality of processing cores, the data read requests being directed to a data partition of a non-volatile memory, and control circuitry coupled to the plurality of sets of registers and to the data partition. The control circuitry, in a read-while-write collision management mode of operation, responds to a data read request received from one processing core of the plurality of processing cores and directed to the data partition by: storing an address associated with the data read request in an address register of one of the plurality of sets of registers associated with the one processing core; suspending write operations directed to the data partition; executing a read operation associated with the read request while the write operations are suspended; storing data responsive to the read operation in one or more data registers of the one of the plurality of sets of registers; and providing the data stored in the one or more data registers of the one of the plurality of sets of registers to the one processing core. In an embodiment, the control circuitry, when the read-while-write collision management mode of operation is not enabled, responds to the data read request received from the one processing core of the plurality of processing cores and directed to the data partition by bypassing the one of the plurality of set of registers associated with the one processing core during processing of the read request.

In an embodiment, a method comprises receiving a data read request from a processing core of a plurality of processing cores, the data read request being directed to a data partition of a non-volatile memory; determining whether to process the data read request using read-while-write collision management: and responding to a determination to process the data read request using read-while-write collision management by: storing an address associated with the data read request in an address register of a set of registers associated with the processing core; suspending write operations directed to the data partition; executing a read operation associated with the read request while the write operations are suspended; storing data responsive to the read operation in one or more data registers of the set of registers; and providing the data stored in the one or more data registers of the set of registers to the processing core.

In an embodiment, a non-transitory computer-readable medium's contents cause a non-volatile memory controller to perform a method, the method comprising: receiving a data read request from a processing core of a plurality of processing cores, the data read request being directed to a data partition of a non-volatile memory; determining whether to process the data read request using read-while-write collision management: and responding to a determination to process the data read request using read-while-write collision management by: storing an address associated with the data read request in an address register of a set of registers associated with the processing core; suspending write operations directed to the data partition; executing a read operation associated with the read request while the write operations are suspended; storing data responsive to the read operation in one or more data registers of the set of registers; and providing the data stored in the one or more data registers of the set of registers to the processing core.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless the context indicates otherwise. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. Moreover, some elements known to those of skill in the art have not been illustrated in the drawings for ease of illustration. One or more embodiments are described hereinafter with reference to the accompanying drawings in which.

DETAILED DESCRIPTION

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to interfaces, power supplies, physical component layout, processing cores, non-volatile memories, memory controllers, etc., have not been shown or described in order to avoid unnecessarily obscuring descriptions of the embodiments. Additionally, the various embodiments may be methods, systems, or devices.

Throughout the specification, claims, and drawings, the following terms take the meaning explicitly associated herein, unless the context indicates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context indicates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context indicates otherwise. In addition, throughout the specification, the meaning of "a," "an," and "the" include singular and plural references.

Figure 1:
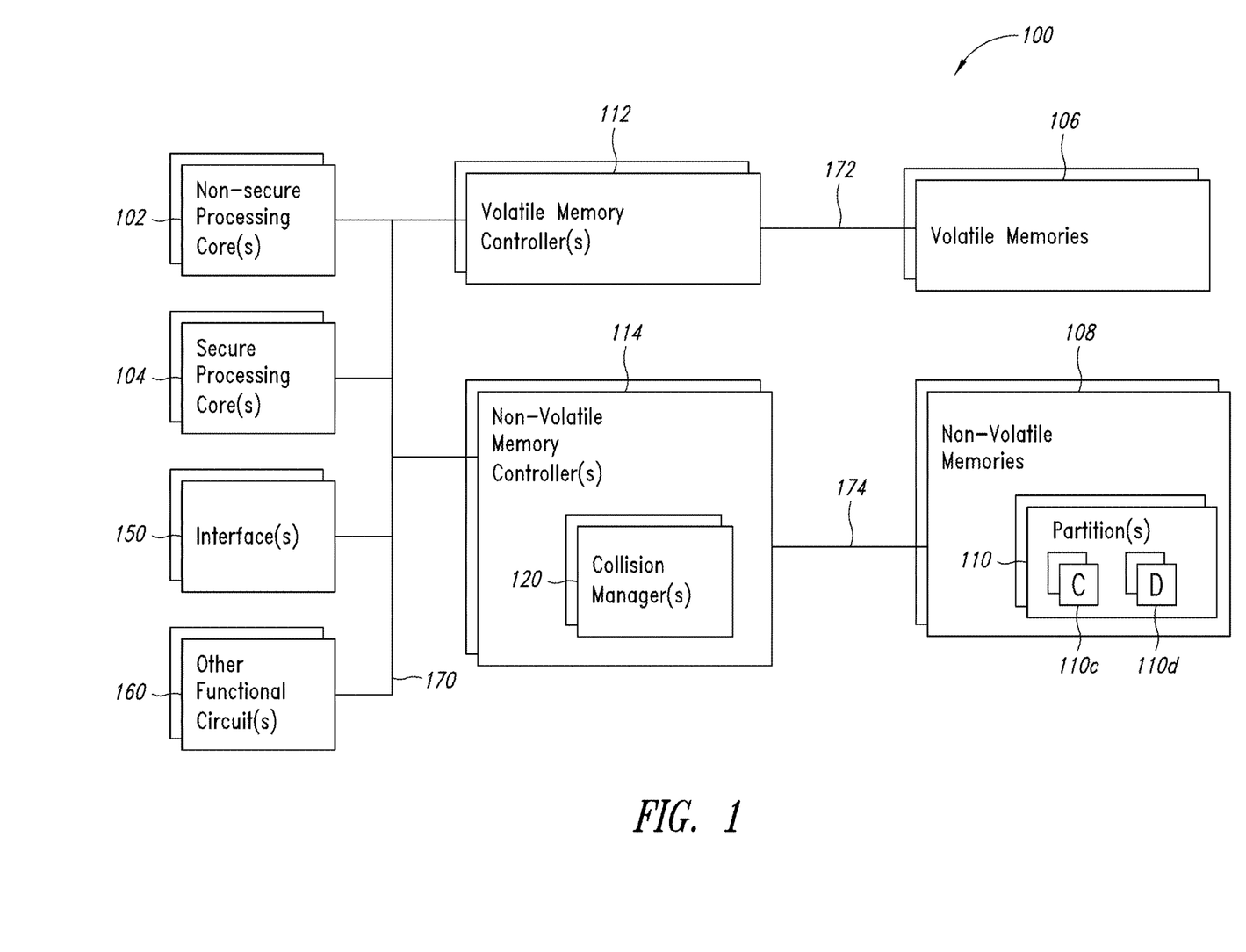
FIG. 1 is a functional block diagram of an embodiment of an electronic device or system having a plurality of processing cores, a non-volatile memory, and a non-volatile memory collision manager according to an embodiment.

FIG. 1 is a functional block diagram of an embodiment of an electronic device or system 100 of the type to which the embodiments, which will be described, may apply. The system 100 comprises one or more processing cores or circuits 102, 104. As illustrated, the processing cores include one or more standard or host processing (or non-secure) cores 102, and one or more secure processing cores 104. The host processing cores 102 may perform software data swaps in shared non-volatile memory (NVM) with other processing cores, and the secure processing cores 104 typically do not perform software data swaps in shared NVM with other processing cores. The processing cores 102, 104 may comprise, for example, one or more processors, a state machine, a microprocessor, a programmable logic circuit, discrete circuitry, logic gates, registers, etc., and various combinations thereof. The processing cores 102, 104 may control overall operation of the system 100, execution of application programs by the system 100, secure operations performed by the system 100, etc.

The system 100 includes one or more memories, such as one or more volatile memories 106 and one or more NVMs 108, which may store, for example, all or part of instructions and data related to control of the system 100, applications and operations performed by the system 100, etc. One or more of the memories 106, 108 may include a memory array (not shown), all or part of which may, in operation, selectively be shared by one or more processes executed by the system 100, such as one or more processes executed by a host processor 102 and one or more processes executed by a secure processor 104.

As illustrated, the non-volatile memories 108 are organized into one or more memory partitions 110, which may comprise, for example, regions of a memory array, individual memory arrays, etc., of a non-volatile memory. The memory partitions 110 may be organized into code storage partitions 110c providing code storage and data storage partitions 110d providing data storage. The volatile memories 106 also may be organized into one or more partitions (not shown). As illustrated, the system 100 includes one or more volatile memory controllers 112 to control accesses to the volatile memories 106 by the processing cores 102, 104, and one or more non-volatile memory controllers 114 to control access to the non-volatile memories 108 by the processing cores 102, 104.

Conventionally, to avoid collisions between read and write data accesses of standard processing cores and secure processing cores to data storage partitions of a non-volatile memory (e.g., a read-while-write collision in a data storage partition 110d between a write access by a secure processing core 104 and a read access by a host processing core 102), separate data partitions of the non-volatile memory are assigned to the host processing cores and to the secure processing cores, which increases the cost in terms of non-volatile memory area, power consumption, etc.

The non-volatile memory controllers or circuits 114, as illustrated, include one or more collision managers or circuits 120, to manage collisions between data accesses to a partition 110d by different processing cores, which facilitates the sharing of one or more data partitions 110d by a host processing core 102 and a secure processing core 104. As discussed in more detail below, the collusion managers 120 may, for example, manage a collision between a write request from one processing core (e.g., a host processing core 102 or a secure processing core 104) to access one or more addresses in a data partition 110d, and a read request from a second processing core (e.g., a host processing core 102 or a secure processing core 104) to access one or more addresses in the data partition 110*d*.

The system 100 may include one or more interfaces 150 (e.g., wireless communication interfaces, wired communication interfaces, controller interfaces, etc.), and other functional circuits 160, which may include antennas, power supplies, sensors (e.g., image sensors, audio sensors, accelerometers, pressure sensors, temperature sensors, encoders, traction motor controllers, etc.), and a main bus system 170. The main bus system 170 may include one or more data, address, power and/or control buses coupled to the various components of the system 100. The system 100 also may include additional bus systems such as bus system 172, which communicatively couples the volatile memories 106 and the volatile memory controllers 112, and bus system 174, which communicatively couples the non-volatile memories 108 and the non-volatile memory controllers 114.

Figure 2:
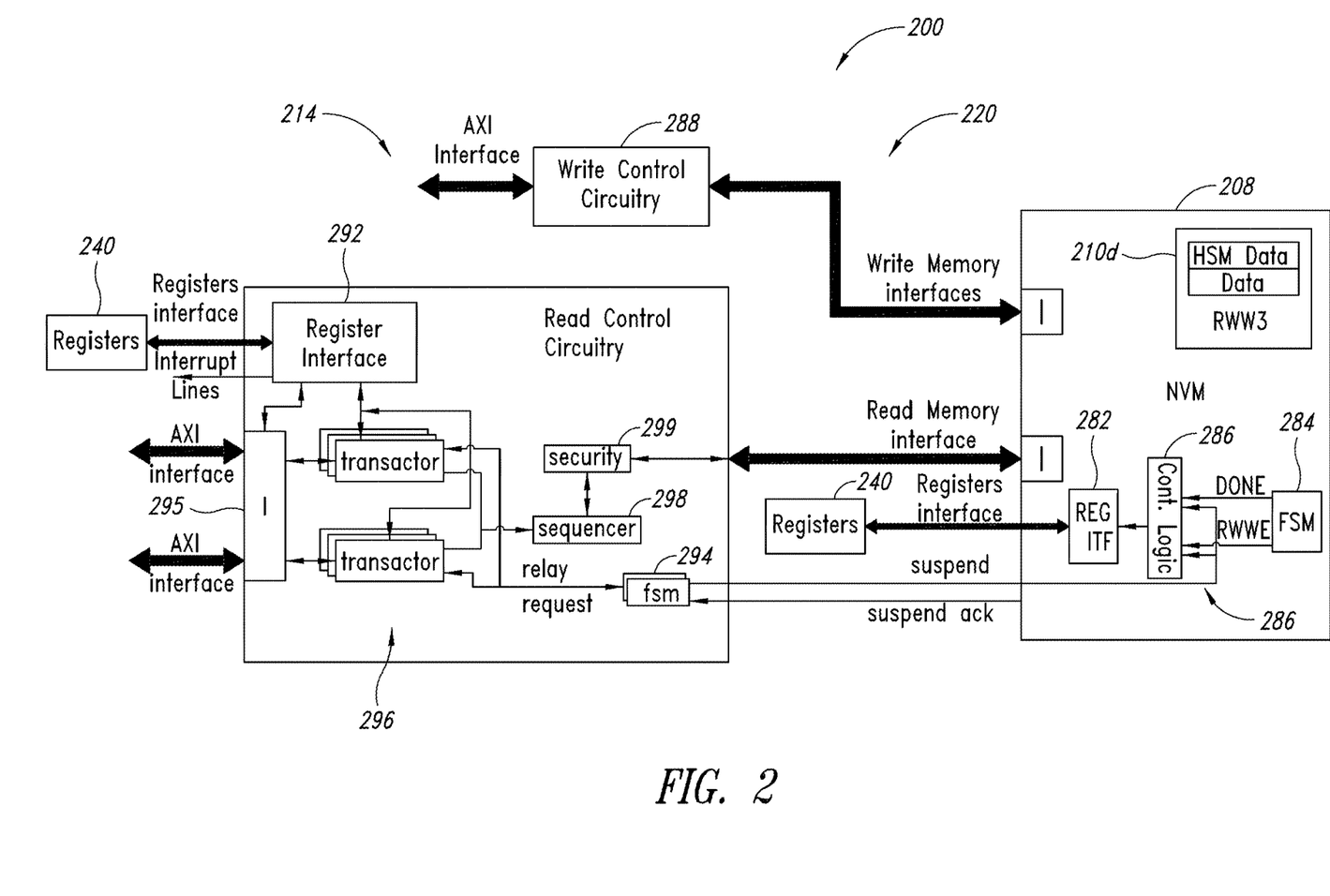
FIG. 2 is a functional block diagram of an embodiment of an electronic device or system having a non-volatile memory collision manager according to an embodiment.
Figure 3:
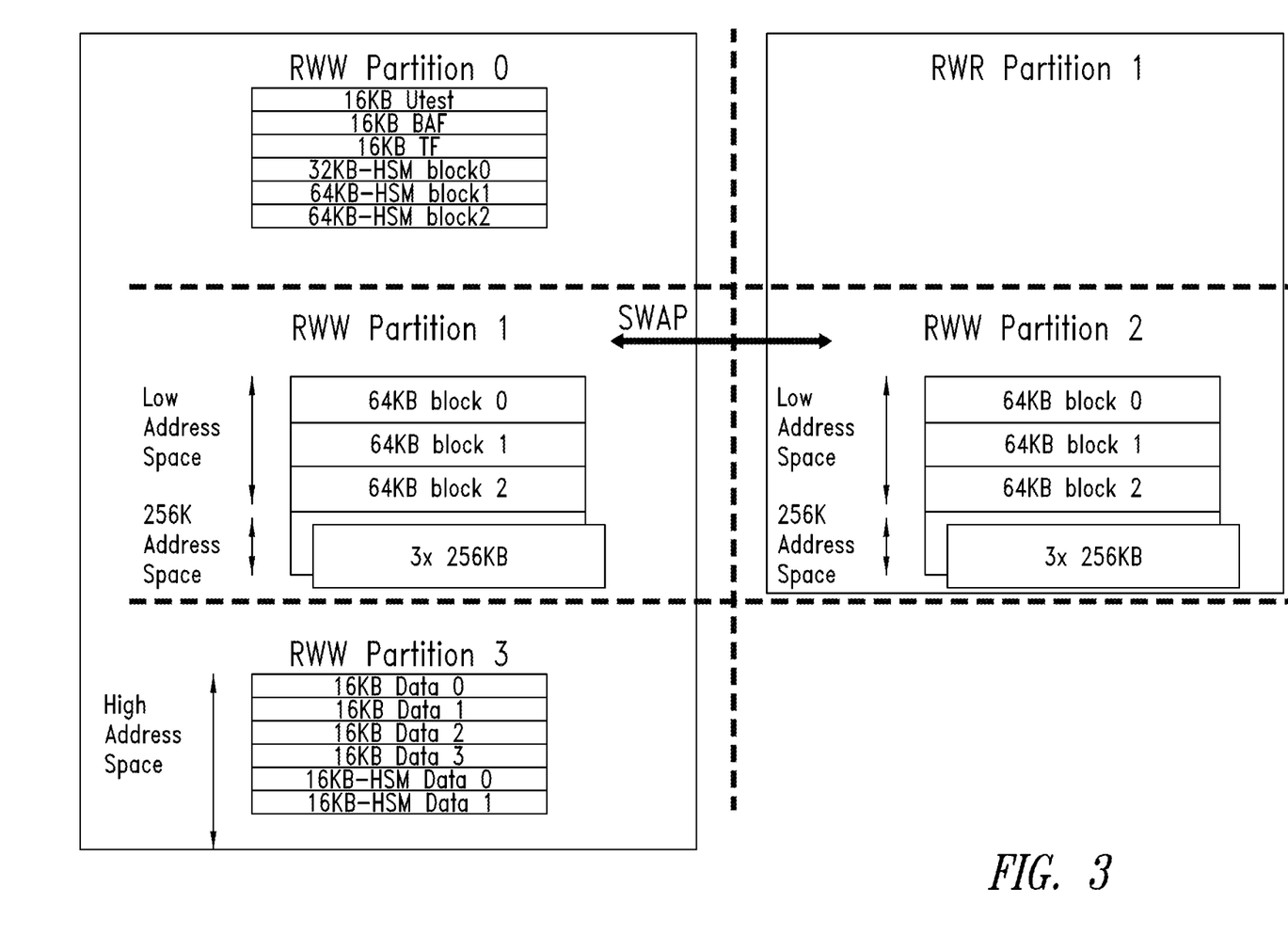
FIG. 3 is a conceptual diagram illustrating the partitioning of a non-volatile memory according to an embodiment.

FIG. 2 is a functional block diagram of a system 200 illustrating an embodiment of a collision manager or circuitry 220, which may be employed in the system 100 of FIG. 1. The system 200 includes a non-volatile memory 208, a non-volatile memory controller 214, and registers 240, which may be included in the non-volatile memory controller 214. As illustrated, the non-volatile memory 208 includes a read-while-write data partition RWW3 210*d*, which, in operation, stores data (data in FIG. 2) of a standard processing core (see processing core 102 of FIG. 1) and stores secure data (HSM data in FIG. 2) of a secure processing core (see processing core 104 of FIG. 1). The non-volatile memory 208 may typically comprise additional memory partitions, as shown in FIG. 3. The non-volatile memory 208 also includes a register interface 282, a finite state machine 284, and logic circuitry 286 coupled to the register interface 282 and the finite state machine 284.

As illustrated, the non-volatile memory controller 214 includes write control circuitry 288 and read-control circuitry 290. The read-control circuitry includes a register interface 292, a finite state machine 294, a plurality of transaction control circuits or transactors 296, sequencing circuitry or a sequencer 298 and a security circuit 299. The registers 240, together with the register interface 282, the finite state machine 284, the logic circuitry 286, the write control circuitry 288 and the read-control circuitry 290, form the collision manager 220.

The register interface 292 controls storage and retrieval of addresses, data, and control information (e.g., control flags) in the registers 240. The finite state machines 284, 294 control the timing of read operations performed using read-while-write collision management. The transactors 296 convert read request addresses to logical addresses of the non-volatile memory. The sequencer 298 sequences requests received from multiple transactors 296. The security circuit 299 verifies that read access to the requested address is granted to the processing core from which the read request originated.

The write control circuitry 288 is coupled to a write memory interface of the non-volatile memory 208, the read control circuitry 290 is coupled to a read memory interface of the non-volatile memory 208, and the finite state machine 294 is coupled to the logic circuitry 286. The write control circuitry 288 receives write requests though an interface, as illustrated in FIG. 2, an Advanced eXtensible Interface (AXI). Similarly, the transactors 296 of the read control circuitry 290 receive read requests through interfaces, as illustrated, AXI interfaces. A read-intercept interface 295 intercepts read requests when read-while-write collision management is enabled. In general, when read-while-write collision management is enabled, reads are performed using the register interfaces 282, 292, with polling employed to indicate when the data is ready to be read from the registers. Examples of operation of the collision manager 220 when collision management is enabled are described in more detail below.

Embodiments of the system 100 of FIG. 1 and of the system 200 of FIG. 2 may include more components than illustrated, may include fewer components than illustrated, may combine illustrated components or split illustrated components, and various combinations thereof. For example, instead of having a separate non-volatile memory 108 and non-volatile memory controller 114, the non-volatile memory 108 of system 100 may be modified to include a non-volatile memory controller 114, which may be split into non-volatile memory write control circuitry (see FIG. 2) and non-volatile memory read control circuitry (see FIG. 2). In another example, the registers 240 may be incorporated into the non-volatile memory controller 214. In another example, the read-intercept interface 295 may be omitted in some embodiments, and the transactors 296 configured provide the read requests to the registers 240 when read-while-write collision management is to be performed. The system 100 or the system 200 may comprise a system on a chip (SoC), discrete chips coupled together, etc., or various combinations thereof.

FIG. 3 is a conceptual diagram illustrating partitioning of a non-volatile memory 308 into partitions, such as the non-volatile memory 108 of FIG. 1, the non-volatile memory 208 of FIG. 2. As illustrated in FIG. 3, the non-volatile memory 308 is partitioned into five memory partitions.

A first partition, RWW Partition 0, is a read-while-write partition having three 16 KB blocks reserved for special purposes, and a 32 KB block and two 64 KB blocks for accesses by secure processing cores (see secure processing core 104 of FIG. 1). A second partition, RWR Partition 1, is a read-while-read partition, details of the blocks of which are not shown in FIG. 3. A third partition, RWW Partition 1, is a read-while-write partition having a low-address space with three 64 KB blocks and a 256K address space having three 256 KB blocks for shared accesses by standard processing cores (see processing core 102 of FIG. 1). A fourth partition, RWW Partition 2, also is a read-while-write partition having a low-address space with three 64 KB blocks and a 246K address space with three 256 KB blocks for shared accesses by standard processing cores (see processing core 102 of FIG. 1). Standard processing cores (e.g., processing cores 102 of FIG. 1) may perform software data swaps between the third partition RWW partition 1 and the fourth partition RWW partition 2.

A fifth partition, RWW partition 3 (e.g., RWW3 210*d* of FIG. 2), is a read-while-write partition shared by standard processing cores (see standard processing cores 102 of FIG. 1) and secure processing cores (see secure processing cores 104 of FIG. 1). The high address space of RWW partition 3 as illustrated includes four 16 KB blocks allocated to unsecure data, data 0, data 1, data 2 and data 3 (e.g., data accessible by a standard processor 102), and two 16 KB blocks allocated to secure data HSM data 0 and HSM data 1. RWW partition 3 is designed as a data partition memory to be shared between the two groups of cores: secured data (HSM Data in the FIG. 3) of secure cores (see cores 104 of FIG. 1) and non-secured data (data in the FIG. 3) of non-secure cores (see cores 102 of FIG. 1). In an embodiment, content access for each group of cores is independent with respect to operations performed by a core of the other group. In other words, a core submitting a read request is unaware when the shared RWW partition 3 is already being subjected to a modify or write operation submitted by another core.

Figure 4:
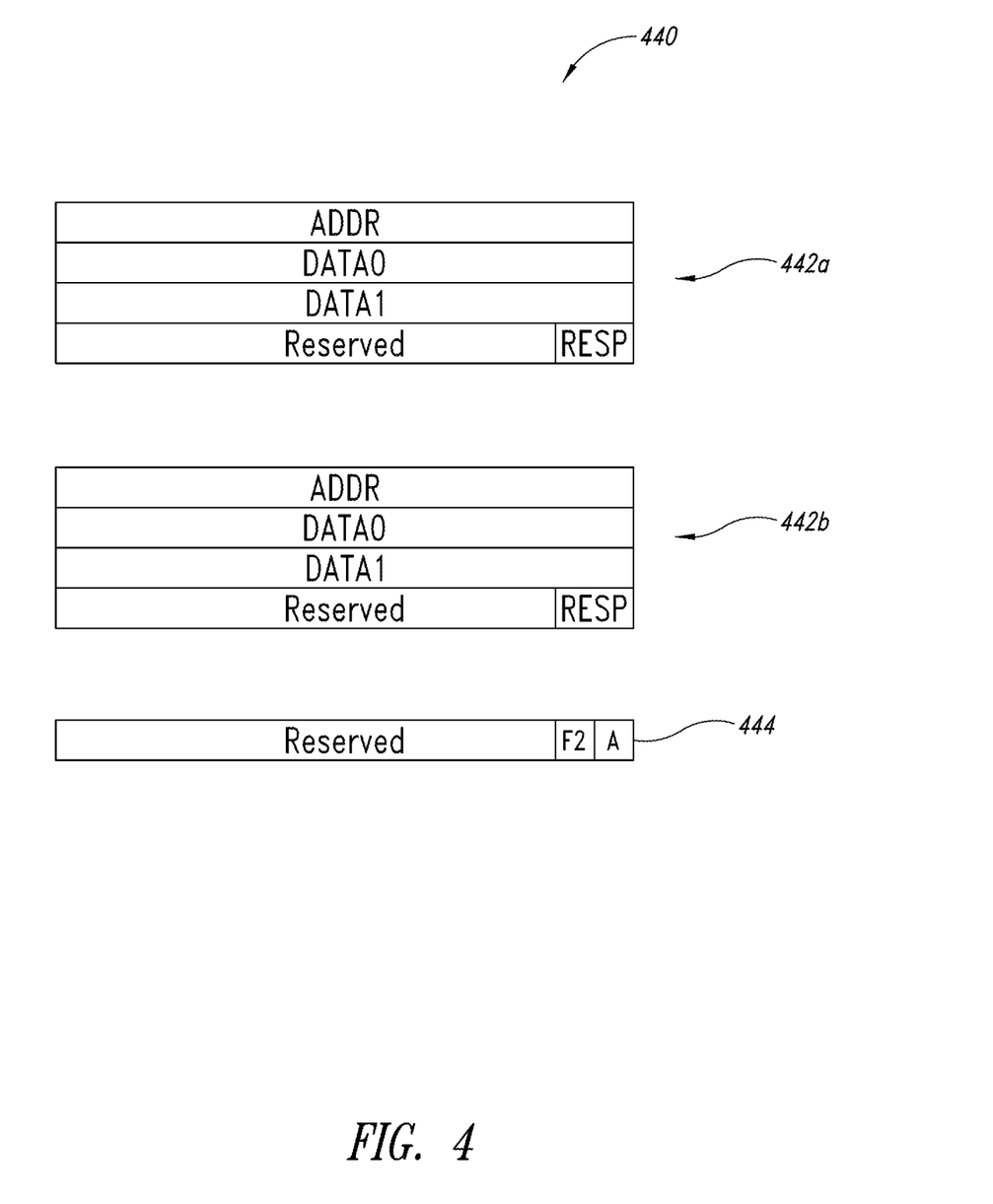
FIG. 4 is a conceptual diagram illustrating organization of registers of a non-volatile collision manager according to an embodiment.

FIG. 4 is a conceptual diagram illustrating organization of a plurality of registers 440 that may be employed, for example, as the registers 240 of the collision manager 220 of FIG. 2. The plurality of registers 440 includes a first set of registers 442a associated with read requests of a standard processing core (e.g., a processing core 102 of FIG. 1, a second set of registers 442b associated with read requests of a secure processing core (e.g., a secure processing core 104 of FIG. 1), and one or more registers 444 to store control information associated with managing read-while-write data collisions, as illustrated flags F1 and F2, which may be used to control polling mechanisms and interrupts.

Figure 5:
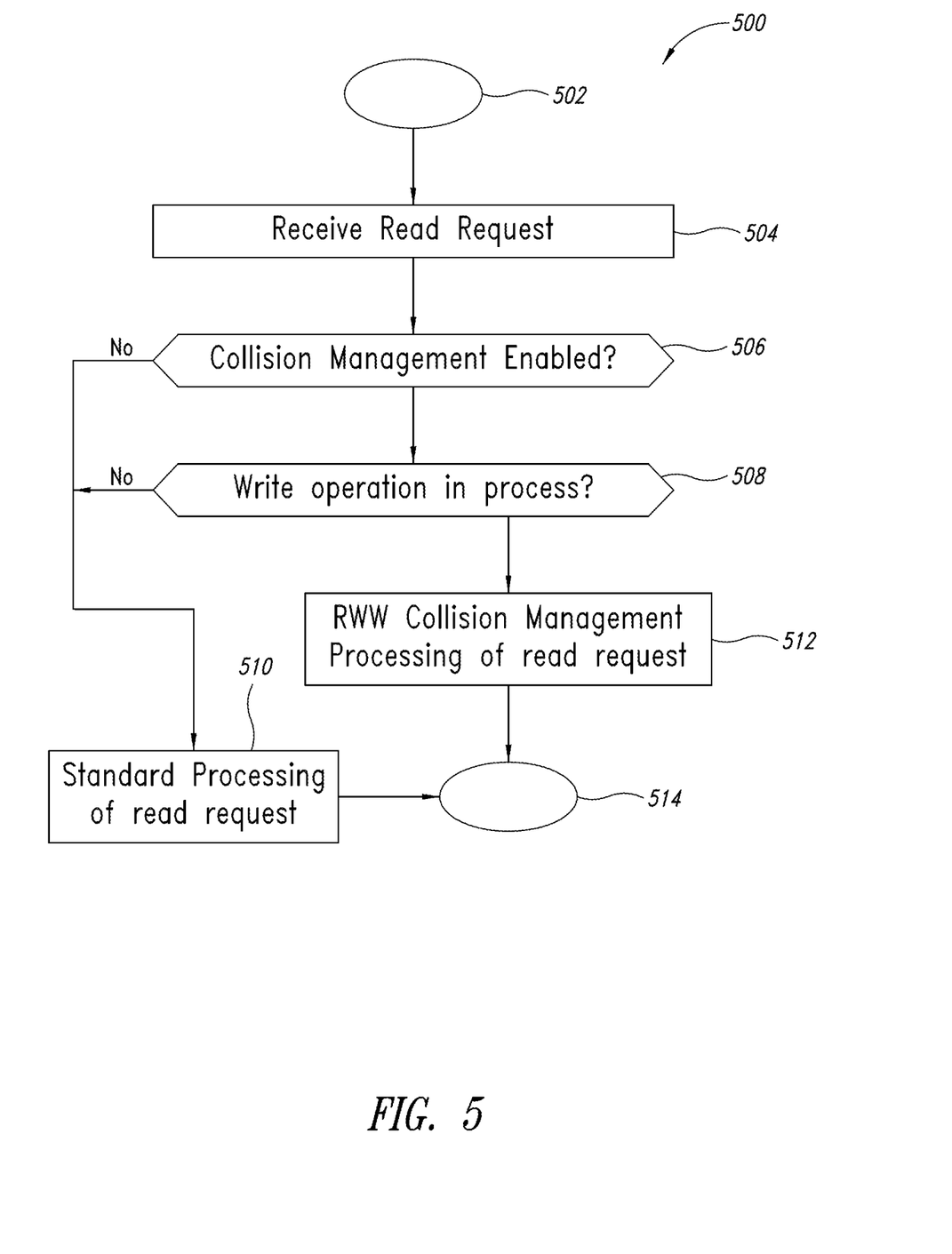
FIG. 5 is a flow chart illustrating an example embodiment of a method of processing a read request to access a read-while-write data partition of a non-volatile memory.

FIG. 5 illustrates an embodiment of a method 500 of determining whether to perform collision management processing of a read request or standard processing of a read in response to a read request received from a processing core and directed to a read-while-write data partition of a non-volatile memory, and will be described for convenience with reference to FIGS. 1 through 4. The method 500 may be performed, for example, under control of the collision management circuitry 120 of FIG. 1 or the collision management circuitry 220 of FIG. 2 using a RWW partition, such as RWW3 partition 210d of FIG. 2.

The method 500 starts at 502 and proceeds to 504. At 504, the method 500 receives a request to read data stored at an address of a partition of a non-volatile memory. For example, a transactor 296 of read control circuitry 290 of FIG. 2 may receive a read request from a processor, such as a standard processing core 102 or a secure processing core 104 of FIG. 1, via a bus system, such as the bus system 170 of FIG. 1, via an interface, such as an AXI interface, a read-intercept interface 295, or various combinations thereof. In response to receiving a read request, the method 500 proceeds from 504 to 506.

At 506, the method 500 determines whether read-while-write collision management is enabled. This may be done, for example, by checking a flag or control signal indicating whether read-while-write collision management is enabled, by determining whether the data partition to which the read request is directed is shared by a standard processing core (e.g., a processing core 102 of FIG. 1) and a secure processing core (e.g., a secure processing core 104 of FIG. 1). When read-while-write collision management is not enabled, the method 500 proceeds from 506 to 510, where processing of the read request is performed without implementing read-while-write collision management. The method 500 proceeds from 510 to 514, where the method 500 may terminate or may perform other processing, such as returning to 504 to wait for another read request.

When read-while-write collision management is enabled, the method proceeds from 506 to 508. At 508, the method 500 determines whether a write operation is in process. With reference to FIG. 2, this may be done, for example, by checking a status of the non-volatile memory 208, or a status of the write control circuitry 288.

When the method 500 determines at 508 that a write operation is in process, the method 500 proceeds from 508 to 512, where processing of the read request is performed using read-while-write collision management. The method 500 proceeds from 512 to 514, where the method 500 may terminate or may perform other processing, such as returning to 504 to wait for another read request.

When the method 500 determines at 508 that a write operation is not in process, the method 500 proceeds from 508 to 510, where processing of the read request is performed without implementing the read request using read-while-write collision management. The method 500 proceeds from 510 to 514, where the method 500 may terminate or may perform other processing, such as returning to 504 to wait for another read request.

Embodiments of the method 500 of FIG. 5 may not include all of the illustrated acts, may include additional acts, may combine acts, may split acts, and may perform acts in various orders. For example, acts 506 and 508 may be performed in various orders, or combined, act 506 may be omitted, for example, when collision management is enabled by default for a partition, etc. In another example, acts 506, 508 and 510 may be omitted in some embodiments, or in some operational modes, and all read requests to a memory partition shared by secure and non-secure processing cores may be handled using collision management processing of the read request. In another example, additional collision management acts may be performed by the method 500, such as acts related to read-while-read or write-while-write collusion management.

Figure 6:
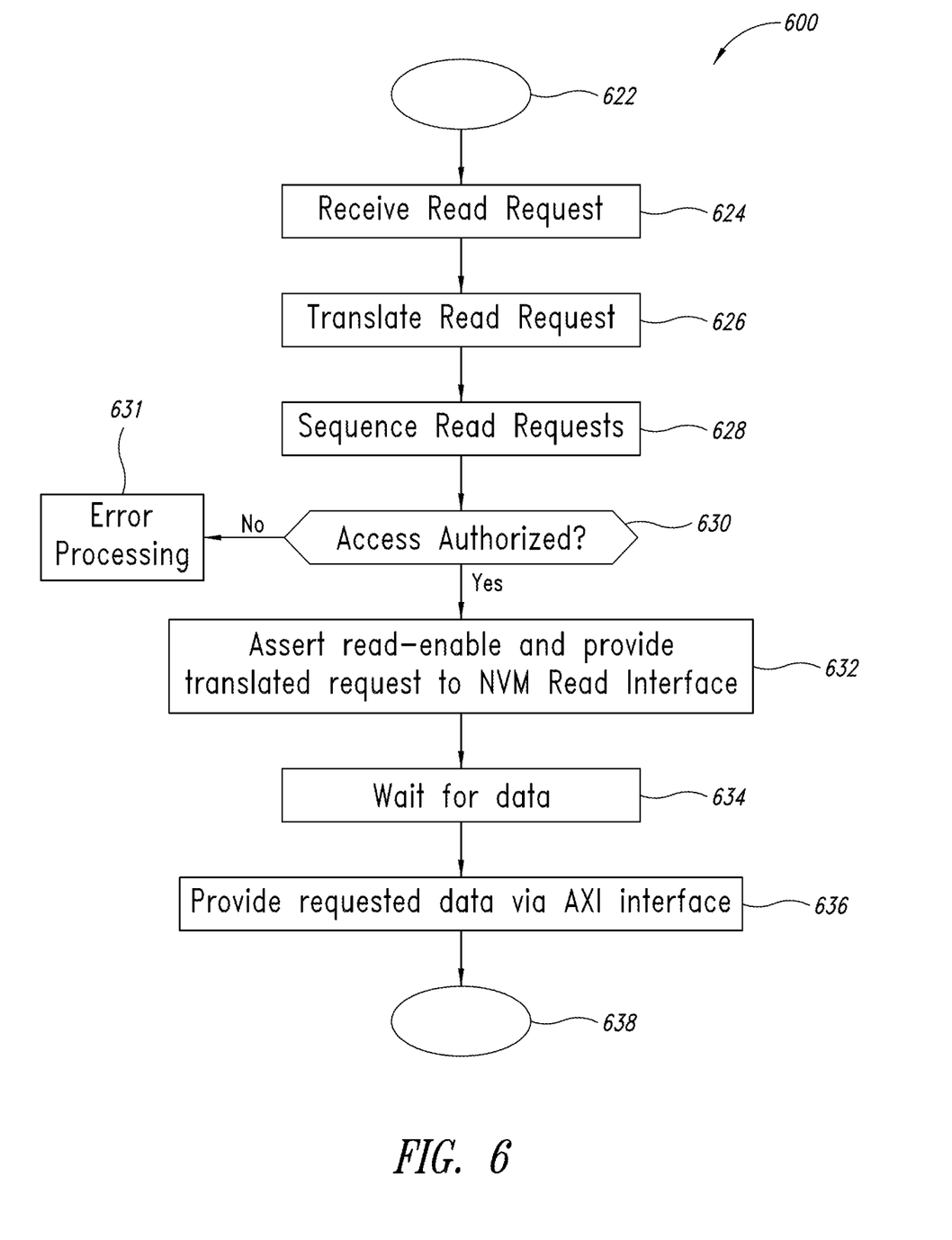
FIG. 6 is a flow chart illustrating an example embodiment of a method of processing a read request to access a read-while-write data partition of a non-volatile memory when read-while-write collision management is not enabled.

FIG. 6 illustrates an embodiment of a method 600 of processing a read request when read-while-write collision management is not enabled, or, in some embodiments, when read-while-write collision management is enabled, but a write operation is not in process when the read request is received. The method 600 will be described for convenience with reference to FIGS. 1 through 5, and may be employed to perform the processing of act 510 in FIG. 5. The method 600 may be performed, for example, under control of the read control circuitry 290 of FIG. 2 using a RWW partition, such as RWW3 partition 210d of FIG. 2.

The method 600 starts at 622 and proceeds to 624. At 624, the method 600 receives a request to read data stored at an address of a partition of a non-volatile memory. For example, a transactor 296 of read control circuitry 290 of FIG. 2 may receive a read request from a processor, such as a standard processing core 102 or a secure processing core 104 of FIG. 1, via a bus system, such as the bus system 170 of FIG. 1, via an interface, such as an AXI interface, a read-intercept interface, or various combinations thereof. In response to receiving a read request, the method 600 proceeds from 624 to 226.

At 626, the method 600 translates the read request in accordance with a read access protocol. For example, a read request received as an AXI transaction request may be translated into a non-volatile memory read request, for example, by a transactor 296. The system address provided with the AXI transaction burst request may be translated into a logical address. The translation at 626 may be performed in a conventional manner. The method 600 proceeds from 626 to 628.

At 628, translated read requests are sequenced for processing by the non-volatile memory, for example, the sequencer 298 may sequence a burst request received from a transactor 296 for processing by the non-volatile memory 208. The sequencing at 628 may be performed in a conventional manner. The method 600 proceeds from 628 to 630.

At 630, the method 600 determines whether the sequenced request is from a processing core authorized to access the requested data. For example, the security circuit 299 may verify the requested access is authorized. The determining whether a request is authorized at 630 may be performed in a conventional manner. When it is determined at 630 that the requested access is not authorized, the method 600 proceeds from 630 to 631, where error or unauthorized access processing may be performed. When it is determined at 630 that the requested access is authorized, the method 600 proceeds from 630 to 632.

At 632, the method 600 asserts a read-enable signal and provides the translated request to the non-volatile memory, for example, via a read memory interface, which may be performed in a conventional manner. The method 600 proceeds from 632 to 634.

At 634, the method 600 waits for the data to be ready, for example, by waiting a programmed number of wait states. The waiting at 634 may be performed in a conventional manner. The method 600 proceeds from 634 to 636.

At 636, the method 600 provides the requested data to the processing core, for example, via an AXI interface, which may be performed in a conventional manner. The method 600 proceeds from 636 to 638, where the method 600 may terminate or may perform other processing, such as returning to 624 to wait for another read request.

Embodiments of the method 600 of FIG. 6 may not include all of the illustrated acts, may include additional acts, may combine acts, may split acts, and may perform acts in various orders. For example, act 632 may be split into multiple acts.

Figure 7:
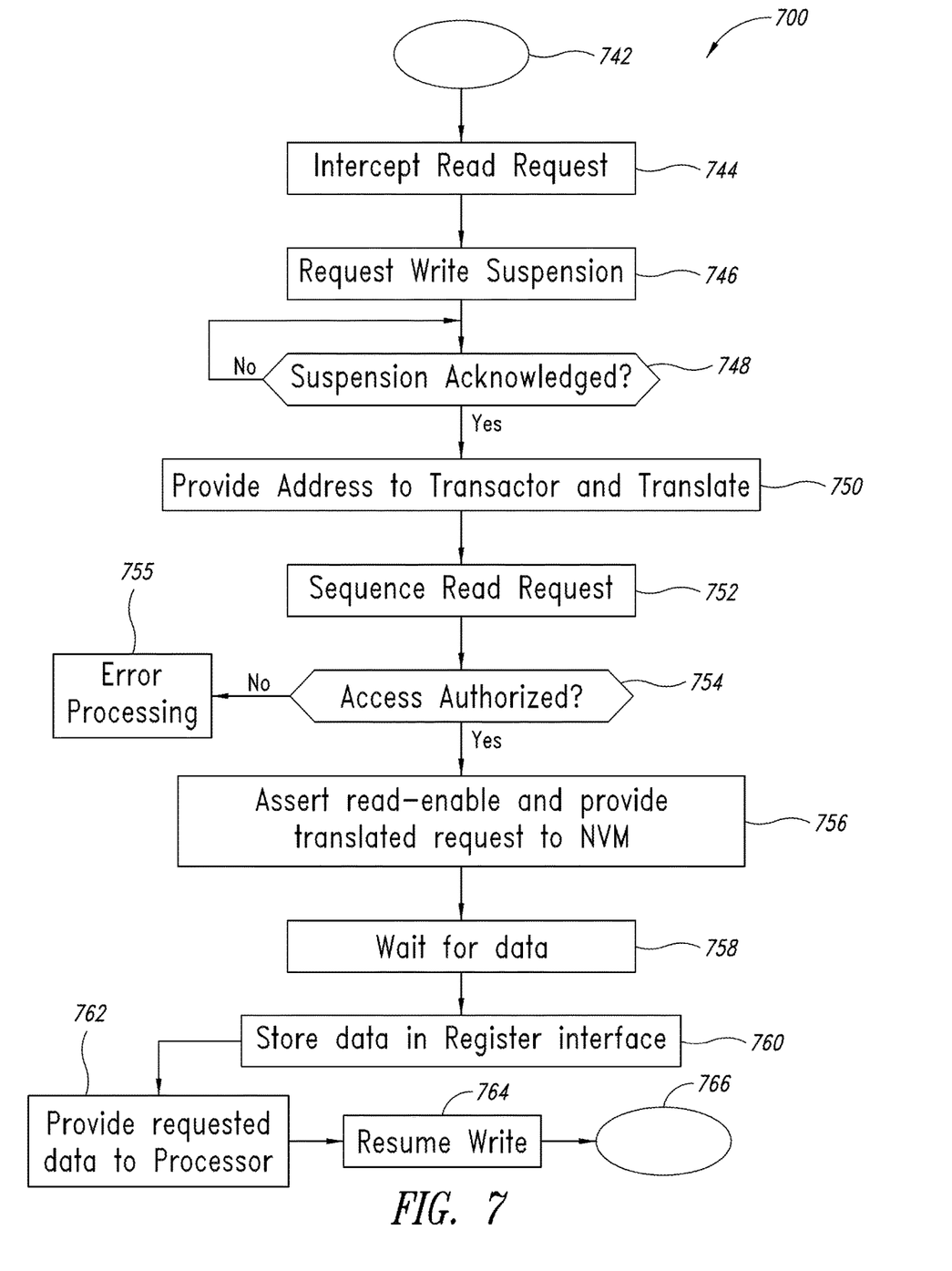
FIG. 7 is a flow chart illustrating an example embodiment of a method of processing a read request to access a read-while-write data partition of a non-volatile memory when read-while-write collision management is enabled.

FIG. 7 illustrates an embodiment of a method 700 of processing a read request when read-while-write collision management is enabled. The method 700 will be described for convenience with reference to FIGS. 1 through 6, and may be employed to perform the processing of act 512 in FIG. 5. The method 700 may be performed, for example, under control of the read control circuitry 290 of FIG. 2 using a RWW partition, such as RWW3 partition 210d of FIG. 2.

The method 700 starts at 742 and proceeds to 744. At 744, the method 700 intercepts a read request to read data stored in a partition of a non-volatile memory while a write request to the partition is being processed, and stores a memory address associated with the read request in a memory register. For example, a read intercept interface 295 or a transactor 296 of read control circuitry 290 of FIG. 2, may intercept a read request from a processor, such as a standard processing core 102 or a secure processing core 104 of FIG. 1, via a bus system, such as the bus system 170 of FIG. 1, via an interface, such as an AXI interface, a read-intercept interface, or various combinations thereof, and store an address associated with the read request in an address register of a set of registers, for example, with reference to FIG. 4, the address register of the set of registers 442a (e.g., in the case where the read request is from a standard processing core 102) or the address register of the set of registers 442b (e.g., in the case where the request is from a secure processing core 104). The method 700 proceeds from 744 to 746. In some embodiments, a processing core (e.g., processing core 102 or processing core 104 of FIG. 1), may write the address in the address register of the set of registers. For example, when all read requests directed to a partition are processed using read-while-write collision management.

At 746, the method 700 requests suspension of the write operation to the partition, and proceeds to 748 to wait for an acknowledgment that the write operation has been suspended. For example, a read-intercept interface 295 or a transactor 296 may relay a suspend request to the finite state machine 294, which generates a suspend signal provided to the non-volatile memory and to the logic circuitry 286. When the write operation has been suspended, the non-volatile memory provides a suspend acknowledgement signal to the finite state machine 294. Once the suspend acknowledgement signal is received, the method 700 proceeds from 748 to 750.

At 750, the method 700 provides an address associated with the read request for translation. For example, with reference to FIG. 4, an address associated with the request stored in an address register of a set of registers 442a (e.g., in the case where the request is from a standard processing core 102) or 442b (e.g., in the case where the request is from a secure processing core 104) may be provided to a transactor 296 for translation. For example, a system address provided with the AXI transaction burst request may be translated in a logical address. The translation at 750 may be performed in a conventional manner. The method 700 proceeds from 750 to 752.

At 752, the translated read request is sequenced for processing by the non-volatile memory, for example, the sequencer 298 may sequence a burst request received from a transactor 296. The sequencing at 752 may be performed in a conventional manner. The method 700 proceeds from 752 to 754.

At 754, the method 700 determines whether the sequenced request is from a processing core authorized to access the requested data. For example, the security circuit 299 may verify the requested access is authorized. The determining whether a request is authorized at 754 may be performed in a conventional manner. When it is determined at 754 that the requested access is not authorized, the method 700 proceeds from 754 to 755, where error or unauthorized access processing may be performed. When it is determined at 754 that the requested access is authorized, the method 700 proceeds from 754 to 756.

At 756, the method 700 asserts a read-enable signal and provides the translated request to the non-volatile memory, for example, via a read memory interface, which may be performed in a conventional manner. The method 700 proceeds from 756 to 758.

At 758, the method 700 waits for the data to be ready, for example, by waiting a programmed number of wait states. The waiting at 758 may be performed in a conventional manner. The method 700 proceeds from 758 to 760.

At 760, the method 700 stores the requested data in the register interface. For example, a data register of a set of registers 442a (e.g., in the case where the request is from a standard processing core 102) or 442b (e.g., in the case where the request is from a secure processing core 104). For example, the non-volatile memory 208 may provide the data to a transactor 296, which stores the data in the data register. The method 700 proceeds from 760 to 762.

At 762, the method 700 provides the requested data to the requesting processing core (e.g., a standard processing core 102 or secure processing core 104). For example, the processing core may read the requested data from the data register. The method 700 proceeds from 762 to 764.

At 764, the method 700 resumes the suspended write operation to the partition. The method 700 proceeds from 764 to 766, where the method 700 may terminate or may perform other processing, such as returning to 744 to wait for another read request.

Embodiments of the method 700 of FIG. 7 may not include all of the illustrated acts, may include additional acts, may combine acts, may split acts, and may perform acts in various orders. For example, acts 760, 762 and 764 may be performed in various orders, acts 760 and 764 may be performed in parallel, etc. In another example, the method 700 may be modified to include acts of responding to additional read requests received during processing of a current read request using read-while-write collision management by sending a decode error.

Figure 8:
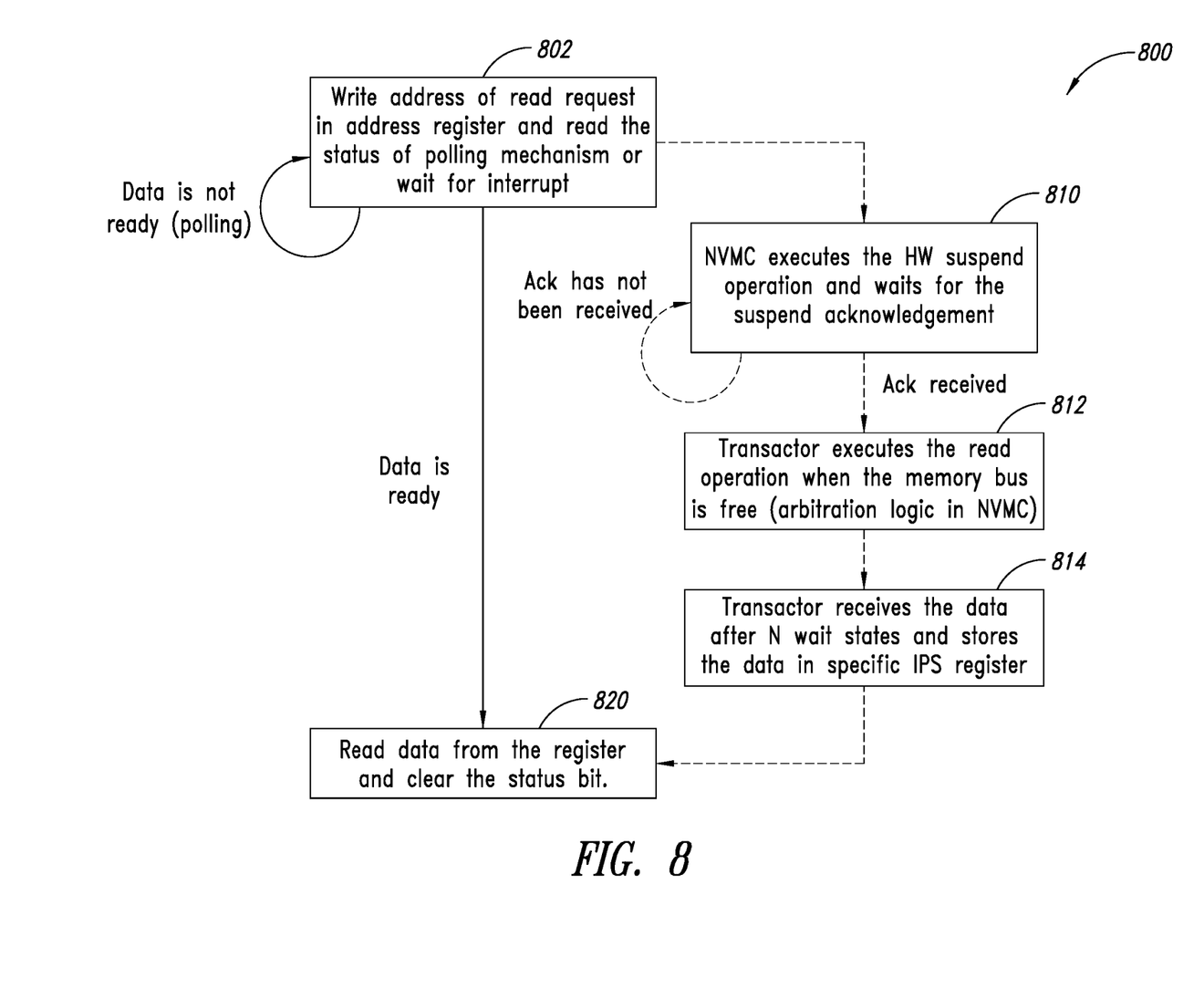
FIG. 8 is a flow chart illustrating another example embodiment of a method of processing a read request to access a read-while-write data partition of a non-volatile memory when read-while-write collision management is enabled.

FIG. 8 is a flow diagram illustrating an embodiment of a method 800 of processing a read request when read-while-write collision management is enabled. The method 800 will be described for convenience with reference to FIGS. 1 through 5, and may be employed to perform the processing of act 512 in FIG. 5. The method 800 may be performed, for example, under control of the read control circuitry 290 of FIG. 2 using a RWW partition, such as RWW3 partition 210d of FIG. 2.

The method 800 starts at 802, where an address of a read request received from a processing core (e.g., processing core 102 or processing core 104 of FIG. 1) is written into an address register of a set of registers, for example, with reference to FIG. 4, the address register of the set of registers 442a (e.g., in the case where the read request is from a standard processing core 102) or the address register of the set of registers 442b (e.g., in the case where the request is from a secure processing core 104). The address may be written into the address register by, for example, the requesting processing core, by a read-intercept interface, or by a transactor. The method 800 waits at 802 for an indication that the requested data has been loaded into one or more data registers of a set of registers associated with the data request, such as data registers of the set of registers 442a (e.g., in the case where the read request is from a standard processing core 102) or data registers of the set of registers 442b (e.g., in the case where the request is from a secure processing core 104). For example, the processing core may read the status of a polling mechanism or wait for an interrupt to provide the indication that the requested data is ready to be read (has been loaded into the registers.

In parallel with the waiting at 802, the method 800 requests at 810 suspension of hardware write operations to the partition and waits for an acknowledgement that hardware write operations to the partition have been suspended. For example, with reference to FIG. 2, the non-volatile memory controller 214 may request suspension of hardware write operations to the partition by the non-volatile memory 208. When the acknowledgement of suspension of hardware write operations is received, the method 800 proceeds from 810 to 812.

At 812, the read operation is executed. For example, with reference to FIG. 2, a transactor 296 may execute the read operation when a memory bus is free (e.g., based on arbitration logic of the non-volatile memory controller). The method proceeds from 812 to 814.

At 814, the requested data is received and stored into the one of the address registers associated with the memory read request. For example, with reference to FIG. 2, a transactor 296 may receive the requested data from the non-volatile memory 208 after N wait states (e.g., a programmable number of wait states), and store the data in one or more data registers of a set of registers associated with the data request, such as data registers of the set of registers 442a (e.g., in the case where the read request is from a standard processing core 102) or data registers of the set of registers 442b (e.g., in the case where the request is from a secure processing core 104). With reference to FIG. 2, the non-volatile memory, after providing the data, masks the done flag and the read-while-write error flag, and clears the suspension of hardware write operations to the partition. The done flag and the read-while write error flags are masked because the write operation is suspended, then resumed, so indicating a write operation is finished, or that a read-while-write error has occurred would be inaccurate. The non-volatile memory controller generates an interrupt, or sets the polling flag, to let the processor know the data is ready.

In response to the indication the data is ready, the method 800 proceeds from 802 to 820, where the data is read from the one or more registers in the set of registers associated with the read request, and an interrupt status bit is cleared to indicate the data is ready to be read.

Embodiments of the method 800 of FIG. 8 may not include all of the illustrated acts, may include additional acts, may combine acts, may split acts, and may perform acts in various orders. For example, act 810 may be split into multiple acts. In another example, the method 800 may be modified to include acts of responding to additional read requests received during processing of a current read request by sending a decode error.

Embodiments may facilitate allowing processors with different security attributes (e.g., a host processor 102 and a secure processor 104) to share a data partition allowing read-while-write access to the shared data partition. For example, a host processor 102 may be executing code independent of the operation of a secure processor 104, and thus be unaware that a write operation is about to start or is underway by the secure processor. In the absence of read-while-write collision management, the host processor would receive an invalid data reading the shared partition. When the read-while-write collision management is enabled, the host processor may assert the read request through the register interfaces while the hardware write operation is suspended, and the hardware write operation may be resumed after the data responsive to the read request is stored in the registers. The signaling to control the read and suspend/resume operations may be handled by the non-volatile memory controller and the non-volatile memory. Thus, read-while-write operations may take place without either processor being aware of the accesses by the other processor. The process of executing the read request (e.g., translation, serializing, and security checks) may be unchanged between accesses where read-while-write collision management is enable and when read-while-write collision management is disabled, and thus security and other aspects of the processing of read requests may be preserved.

In an embodiment, a device comprises: a plurality of sets of registers, which, in operation, store addresses and data associated with data read requests received from respective processing cores of a plurality of processing cores, the data read requests being directed to a data partition of a non-volatile memory; and control circuitry coupled to the plurality of sets of registers, wherein the control circuitry, in a read-while-write collision management mode of operation, responds to a data read request received from one processing core of the plurality of processing cores and directed to the data partition by: storing an address associated with the data read request in an address register of one of the plurality of sets of registers associated with the one processing core; requesting suspension of write operations directed to the data partition and execution of a read operation associated with the read request while the write operations are suspended; storing data responsive to the read operation in one or more data registers of the one of the plurality of sets of registers; and providing the data stored in the one or more data registers of the one of the plurality of sets of registers to the one processing core. In an embodiment, the control circuitry, in operation: responds to a determination that a write operation directed to the data partition is being executed when the read request is received by enabling the read-while-write collision management mode of operation. In an embodiment, the requesting suspension of write operations directed to the data partition and execution of a read operation associated with the read request while the write operations are suspended comprises: waiting for an acknowledgement of suspension of the write operations before requesting execution of the read operation. In an embodiment, the control circuitry, in operation, responds to receipt of the data responsive to the read operation by clearing the suspension of write operations directed to the data partition. In an embodiment, the requesting execution of the read operation comprises responding to the suspension of the write operations by: translating the address stored in the address register of one of the plurality of sets of registers into a logical address of the data partition; sequencing the read request; verifying the read request is authorized; asserting a read-enable signal and providing the translated address to the non-volatile memory. In an embodiment, the device comprises the non-volatile memory. In an embodiment, the plurality of processing cores comprises a host processing core and a secure processing core. In an embodiment, the control circuitry, when the read-while-write collision management mode of operation is not enabled, responds to the data read request received from the one processing core of the plurality of processing cores and directed to the data partition by: translating the address associated with the read request into a logical address of the data partition; sequencing the read request; verifying the read request is authorized; asserting a read-enable signal and providing the translated address to the non-volatile memory. In an embodiment, the control circuitry, when the read-while-write collision management mode of operation is not enabled, responds to the data read request received from the one processing core of the plurality of processing cores and directed to the data partition by bypassing the one of the plurality of set of registers associated with the one processing core during processing of the read request.

In an embodiment, a system comprises: a plurality of processing cores; and a non-volatile memory coupled to the plurality of processing cores, the non-volatile memory having: a data partition; a plurality of sets of registers, which, in operation, store addresses and data associated with data read requests received from respective processing cores of the plurality of processing cores, the data read requests being directed to a data partition of a non-volatile memory; and control circuitry coupled to the plurality of sets of registers and to the data partition, wherein the control circuitry, in a read-while-write collision management mode of operation, responds to a data read request received from one processing core of the plurality of processing cores and directed to the data partition by: storing an address associated with the data read request in an address register of one of the plurality of sets of registers associated with the one processing core; suspending write operations directed to the data partition; executing a read operation associated with the read request while the write operations are suspended; storing data responsive to the read operation in one or more data registers of the one of the plurality of sets of registers; and providing the data stored in the one or more data registers of the one of the plurality of sets of registers to the one processing core. In an embodiment, the control circuitry, in operation: responds to a determination that a write operation directed to the data partition is being executed when the read request is received by enabling the read-while-write collision management mode of operation. In an embodiment, the executing of the read operation associated with the read request while the write operations are suspended comprises: waiting for an acknowledgement of suspension of the write operations before executing the read operation. In an embodiment, the executing of the read operation comprises: translating the address stored in the address register of one of the plurality of sets of registers into a logical address of the data partition; sequencing the read request; and verifying the read request is authorized. In an embodiment, the plurality of processing cores comprises a host processing core and a secure processing core. In an embodiment, the control circuitry, when the read-while-write collision management mode of operation is not enabled, responds to the data read request received from the one processing core of the plurality of processing cores and directed to the data partition by: translating the address associated with the read request into a logical address of the data partition; sequencing the read request; and verifying the read request is authorized. In an embodiment, the control circuitry, when the read-while-write collision management mode of operation is not enabled, responds to the data read request received from the one processing core of the plurality of processing cores and directed to the data partition by bypassing the one of the plurality of set of registers associated with the one processing core during processing of the read request.

In an embodiment, a method comprises: receiving a data read request from a processing core of a plurality of processing cores, the data read request being directed to a data partition of a non-volatile memory; determining whether to process the data read request using read-while-write collision management: and responding to a determination to process the data read request using read-while-write collision management by: storing an address associated with the data read request in an address register of a set of registers associated with the processing core; suspending write operations directed to the data partition; executing a read operation associated with the read request while the write operations are suspended; storing data responsive to the read operation in one or more data registers of the set of registers; and providing the data stored in the one or more data registers of the set of registers to the processing core. In an embodiment, the determining whether to process the data read request using read-while-write collision management control circuitry comprises determining whether a write operation directed to the data partition is being executed when the read request is received. In an embodiment, the method comprises using data polling to provide the data stored in the one or more data registers to the processing core. In an embodiment, the executing of the read operation comprises: translating the address stored in the address register into a logical address of the data partition; sequencing the read request; and verifying the read request is authorized. In an embodiment, the plurality of processing cores comprises a host processing core and a secure processing core. In an embodiment, the method comprises responding to a determination to process the read request without using read-while-write collision management by bypassing the set of registers associated with the processing core during processing of the read request. In an embodiment, the method comprises: receiving a second data read request from a second processing core of a plurality of processing cores, the second data read request being directed to the data partition of the non-volatile memory; determining whether to process the second data read request using read-while-write collision management: responding to a determination to process the second data read request using read-while-write collision management by: storing an address associated with the second data read request in an address register of a second set of registers associated with the second processing core; suspending write operations directed to the data partition; executing a second read operation associated with the second read request while the write operations are suspended; storing data responsive to the second read operation in one or more data registers of the second set of registers; and providing the data stored in the one or more data registers of the second set of registers to the second processing core.

In an embodiment, a non-transitory computer-readable medium's contents cause a non-volatile memory controller to perform a method, the method comprising: receiving a data read request from a processing core of a plurality of processing cores, the data read request being directed to a data partition of a non-volatile memory; determining whether to process the data read request using read-while-write collision management: and responding to a determination to process the data read request using read-while-write collision management by: storing an address associated with the data read request in an address register of a set of registers associated with the processing core; suspending write operations directed to the data partition; executing a read operation associated with the read request while the write operations are suspended; storing data responsive to the read operation in one or more data registers of the set of registers; and providing the data stored in the one or more data registers of the set of registers to the processing core. In an embodiment, the method comprises responding to a determination to process the read request without using read-while-write collision management by bypassing the set of registers associated with the processing core during processing of the read request. In an embodiment, the contents comprise instructions executed by the non-volatile memory controller.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a plurality of sets of registers, which, in operation, store addresses and data associated with data read requests received from respective processing cores of a plurality of processing cores, the data read requests being directed to a data partition of a non-volatile memory; and
control circuitry coupled to the plurality of sets of registers, wherein the control circuitry, in a read-while-write collision management mode of operation, responds to a data read request received from one processing core of the plurality of processing cores and directed to the data partition by:
  storing an address associated with the data read request in an address register of one of the plurality of sets of registers associated with the one processing core;
  requesting suspension of write operations directed to the data partition;
  in response to an acknowledgement of suspension of the write operations, requesting execution of a read operation associated with the read request while the write operations are suspended;
  storing data responsive to the read operation in one or more data registers of the one of the plurality of sets of registers; and
  providing the data stored in the one or more data registers of the one of the plurality of sets of registers to the one processing core.

2. The device of claim 1, wherein the control circuitry, in operation:
responds to a determination that a write operation directed to the data partition is being executed when the read request is received by enabling the read-while-write collision management mode of operation.

3. The device of claim 1, wherein the control circuitry, in operation, responds to receipt of the data responsive to the read operation by clearing the suspension of write operations directed to the data partition.

4. The device of claim 1, wherein the requesting execution of the read operation comprises responding to the suspension of the write operations by:
translating the address stored in the address register of one of the plurality of sets of registers into a logical address of the data partition;
sequencing the read request;
verifying the read request is authorized; and
asserting a read-enable signal and providing the translated address to the non-volatile memory.

5. The device of claim 1, comprising the non-volatile memory.

6. The device of claim 1, wherein the plurality of processing cores comprises a host processing core and a secure processing core.

7. The device of claim 1, wherein the control circuitry, when the read-while-write collision management mode of operation is not enabled, responds to the data read request received from the one processing core of the plurality of processing cores and directed to the data partition by:
translating the address associated with the read request into a logical address of the data partition;
sequencing the read request;
verifying the read request is authorized; and
asserting a read-enable signal and providing the translated address to the non-volatile memory.

8. A device, comprising:
a plurality of sets of registers, which, in operation, store addresses and data associated with data read requests received from respective processing cores of a plurality of processing cores, the data read requests being directed to a data partition of a non-volatile memory; and
control circuitry coupled to the plurality of sets of registers, wherein the control circuitry, in a read-while-write collision management mode of operation, responds to a data read request received from one processing core of the plurality of processing cores and directed to the data partition by:
storing an address associated with the data read request in an address register of one of the plurality of sets of registers associated with the one processing core;
requesting suspension of write operations directed to the data partition and execution of a read operation associated with the read request while the write operations are suspended;
storing data responsive to the read operation in one or more data registers of the one of the plurality of sets of registers; and
providing the data stored in the one or more data registers of the one of the plurality of sets of registers to the one processing core, wherein the control circuitry, when the read-while-write collision management mode of operation is not enabled, responds to the data read request received from the one processing core of the plurality of processing cores and directed to the data partition by bypassing the one of the plurality of set of registers associated with the one processing core during processing of the read request.

9. The device of claim 8, wherein the requesting suspension of write operations directed to the data partition and execution of a read operation associated with the read request while the write operations are suspended comprises:
waiting for an acknowledgement of suspension of the write operations before requesting execution of the read operation.

10. A system, comprising:
a plurality of processing cores; and
a non-volatile memory coupled to the plurality of processing cores, the non-volatile memory having:
a data partition;
a plurality of sets of registers, which, in operation, store addresses and data associated with data read requests received from respective processing cores of the plurality of processing cores, the data read requests being directed to a data partition of a non-volatile memory; and
control circuitry coupled to the plurality of sets of registers and to the data partition, wherein the control circuitry, in a read-while-write collision management mode of operation, responds to a data read request received from one processing core of the plurality of processing cores and directed to the data partition by:
storing an address associated with the data read request in an address register of one of the plurality of sets of registers associated with the one processing core;
suspending write operations directed to the data partition;
executing a read operation associated with the read request while the write operations are suspended;
storing data responsive to the read operation in one or more data registers of the one of the plurality of sets of registers; and
providing the data stored in the one or more data registers of the one of the plurality of sets of registers to the one processing core, wherein the executing of the read operation associated with the read request while the write operations are suspended comprises waiting for an acknowledgement of suspension of the write operations before executing the read operation.

11. The system of claim 10, wherein the control circuitry, in operation:
responds to a determination that a write operation directed to the data partition is being executed when the read request is received by enabling the read-while-write collision management mode of operation.

12. The system of claim 10, wherein the plurality of processing cores comprises a host processing core and a secure processing core.

13. The system of claim 10, wherein the control circuitry, when the read-while-write collision management mode of operation is not enabled, responds to the data read request received from the one processing core of the plurality of processing cores and directed to the data partition by:
translating the address associated with the read request into a logical address of the data partition;
sequencing the read request; and
verifying the read request is authorized.

14. The system of claim 10, wherein the control circuitry, when the read-while-write collision management mode of operation is not enabled, responds to the data read request received from the one processing core of the plurality of processing cores and directed to the data partition by bypassing the one of the plurality of set of registers associated with the one processing core during processing of the read request.

15. A system, comprising:
a plurality of processing cores; and
a non-volatile memory coupled to the plurality of processing cores, the non-volatile memory having:
a data partition;
a plurality of sets of registers, which, in operation, store addresses and data associated with data read requests received from respective processing cores of the plurality of processing cores, the data read requests being directed to a data partition of a non-volatile memory; and
control circuitry coupled to the plurality of sets of registers and to the data partition, wherein the control circuitry, in a read-while-write collision management mode of operation, responds to a data read request received from one processing core of the plurality of processing cores and directed to the data partition by:
storing an address associated with the data read request in an address register of one of the plurality of sets of registers associated with the one processing core;
suspending write operations directed to the data partition;
executing a read operation associated with the read request while the write operations are suspended;
storing data responsive to the read operation in one or more data registers of the one of the plurality of sets of registers; and providing the data stored in the one or more data registers of the one of the plurality of sets of registers to the one processing core, wherein the executing of the read operation comprises:
translating the address stored in the address register of one of the plurality of sets of registers into a logical address of the data partition;
sequencing the read request; and
verifying the read request is authorized.

16. The system of claim 15, wherein the executing of the read operation associated with the read request while the write operations are suspended comprises:
waiting for an acknowledgement of suspension of the write operations before executing the read operation.

17. A method, comprising:
receiving a data read request from a processing core of a plurality of processing cores, the data read request being directed to a data partition of a non-volatile memory;
determining whether to process the data read request using read-while-write collision management:
responding to a determination to process the data read request using the read-while-write collision management by:
storing an address associated with the data read request in an address register of a set of registers associated with the processing core;
suspending write operations directed to the data partition;
executing a read operation associated with the read request while the write operations are suspended;
storing data responsive to the read operation in one or more data registers of the set of registers; and
providing the data stored in the one or more data registers of the set of registers to the processing core; and
responding to a determination to process the read request without using the read-while-write collision management by bypassing the set of registers associated with the processing core during processing of the read request.

18. The method of claim 17, wherein determining whether to process the data read request using the read-while-write collision management comprises determining whether a write operation directed to the data partition is being executed when the read request is received.

19. The method of claim 17, comprising using data polling to provide the data stored in the one or more data registers to the processing core.

20. The method of claim 17, wherein the plurality of processing cores comprises a host processing core and a secure processing core.

21. The method of claim 17, comprising:
receiving a second data read request from a second processing core of a plurality of processing cores, the second data read request being directed to the data partition of the non-volatile memory;
determining whether to process the second data read request using the read-while-write collision management:
responding to a determination to process the second data read request using the read-while-write collision management by:
storing an address associated with the second data read request in an address register of a second set of registers associated with the second processing core;
suspending write operations directed to the data partition;
executing a second read operation associated with the second read request while the write operations are suspended;
storing data responsive to the second read operation in one or more data registers of the second set of registers; and
providing the data stored in the one or more data registers of the second set of registers to the second processing core.

22. A method, comprising:
receiving a data read request from a processing core of a plurality of processing cores, the data read request being directed to a data partition of a non-volatile memory;
determining whether to process the data read request using read-while-write collision management:
responding to a determination to process the data read request using the read-while-write collision management by:
storing an address associated with the data read request in an address register of a set of registers associated with the processing core;
suspending write operations directed to the data partition;
executing a read operation associated with the read request while the write operations are suspended;
storing data responsive to the read operation in one or more data registers of the set of registers; and
providing the data stored in the one or more data registers of the set of registers to the processing core, wherein the executing of the read operation comprises:
translating the address stored in the address register into a logical address of the data partition;
sequencing the read request; and
verifying the read request is authorized.

23. The method of claimer 22, comprising responding to a determination to process the read request without using the read-while-write collision management by bypassing the set of registers associated with the processing core during processing of the read request.

24. A non-transitory computer-readable medium having contents which cause a non-volatile memory controller to perform a method, the method comprising:
receiving a data read request from a processing core of a plurality of processing cores, the data read request being directed to a data partition of a non-volatile memory;
determining whether to process the data read request using the read-while-write collision management:
responding to a determination to process the data read request using the read-while-write collision management by:
storing an address associated with the data read request in an address register of a set of registers associated with the processing core;
suspending write operations directed to the data partition;
executing a read operation associated with the read request while the write operations are suspended;
storing data responsive to the read operation in one or more data registers of the set of registers; and
providing the data stored in the one or more data registers of the set of registers to the processing core; and responding to a determination to process the read request without using the read-while-write collision management by bypassing the set of registers associated with the processing core during processing of the read request.

25. The non-transitory computer-readable medium of claim 24, wherein the contents comprise instructions executed by the non-volatile memory controller.

* * * * *

UNITED STATES PATENT AND TRADEMARK OFFICE
CERTIFICATE OF CORRECTION

| | | |
|---|---|---|
| PATENT NO. | : 12,014,084 B2 | Page 1 of 1 |
| APPLICATION NO. | : 17/669085 | |
| DATED | : June 18, 2024 | |
| INVENTOR(S) | : Fabio Enrico Carlo Disegni et al. | |

It is certified that error appears in the above-identified patent and that said Letters Patent is hereby corrected as shown below:

In the Claims

<u>Column 20, Claim 23, Line 39</u>:
"The method of claimer 22,"
Should read:
--The method of claim 22,--.

<u>Column 20, Claim 24, Line 52</u>:
"using the read-while-write"
Should read:
--using read-while-write--.

Signed and Sealed this
Thirteenth Day of August, 2024

Katherine Kelly Vidal
*Director of the United States Patent and Trademark Office*